(12) United States Patent
Liu

(10) Patent No.: US 8,735,293 B2
(45) Date of Patent: May 27, 2014

(54) CHEMICAL MECHANICAL POLISHING COMPOSITION AND METHODS RELATING THERETO

(75) Inventor: Zhendong Liu, King of Prussia, PA (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 1130 days.

(21) Appl. No.: 12/264,928

(22) Filed: Nov. 5, 2008

(65) Prior Publication Data

US 2010/0112906 A1 May 6, 2010

(51) Int. Cl.
*H01L 21/302* (2006.01)
*H01L 21/461* (2006.01)
*H01L 21/321* (2006.01)
*H01L 45/00* (2006.01)
*C09K 13/02* (2006.01)
*C09G 1/02* (2006.01)

(52) U.S. Cl.
CPC .......... H01L 21/3212 (2013.01); H01L 45/144 (2013.01); *C09G 1/02* (2013.01)
USPC .......... 438/693; 438/692; 438/689; 252/79.1; 252/79.2; 252/79.3; 252/79.4; 252/79.5

(58) Field of Classification Search
CPC ..... H01L 21/302; H01L 21/304; H01L 45/06; H01L 45/144
USPC ................ 438/692, 693, 689; 252/79.1, 79.2, 252/79.3, 79.4, 79.5
See application file for complete search history.

(56) References Cited

U.S. PATENT DOCUMENTS

| | | | |
|---|---|---|---|
| 6,884,144 B2 | 4/2005 | Chandrasekaran et al. | |
| 7,297,633 B1 * | 11/2007 | Mueller | 438/692 |
| 7,381,647 B2 | 6/2008 | Chandrasekaran et al. | |
| 2003/0041452 A1 | 3/2003 | Sinha | |
| 2004/0033757 A1 | 2/2004 | Chandrasekaran et al. | |
| 2004/0132306 A1 | 7/2004 | Bellman et al. | |
| 2007/0020799 A1 | 1/2007 | Choi et al. | |
| 2007/0161186 A1 | 7/2007 | Ho | |
| 2007/0178700 A1 | 8/2007 | Dysard et al. | |
| 2008/0017841 A1 | 1/2008 | Lee et al. | |
| 2008/0190035 A1 * | 8/2008 | Lu et al. | 51/307 |
| 2009/0001339 A1 * | 1/2009 | Lee et al. | 257/2 |
| 2009/0057834 A1 * | 3/2009 | Schlueter et al. | 257/613 |
| 2010/0190339 A1 * | 7/2010 | Chen et al. | 438/693 |

OTHER PUBLICATIONS

Zhang, et al., "Study on Chemical Mechanical Polishing of GeSbTe for Chalcogenide Phase Change Memory", IEEE (2006).

* cited by examiner

*Primary Examiner* — Nadine Norton
*Assistant Examiner* — Mahmoud Dahimene
(74) *Attorney, Agent, or Firm* — Thomas S. Deibert

(57) ABSTRACT

A method for chemical mechanical polishing of a substrate comprising a germanium-antimony-tellurium chalcogenide phase change alloy using a chemical mechanical polishing composition comprising water; 1 to 40 wt % colloidal silica abrasive particles having an average particle size of ≤50 nm; and 0 to 5 wt % quarternary ammonium compound; wherein the chemical mechanical polishing composition is oxidizer free and chelating agent free; and, wherein the chemical mechanical polishing composition has a pH >6 to 12.

2 Claims, No Drawings

CHEMICAL MECHANICAL POLISHING COMPOSITION AND METHODS RELATING THERETO

The present invention relates to chemical mechanical polishing compositions and methods of using the same. More particularly, the present invention relates to chemical mechanical polishing compositions for polishing a substrate having a phase change alloy (e.g., germanium-antimony-tellurium phase change alloy).

Phase change random access memory (PRAM) devices that use phase change materials that can be electrically transitioned between an insulating, generally amorphous state and a conductive, generally crystalline state have become a leading candidate for the next generation of memory devices. These next generation PRAM devices may replace conventional solid state memory devices such as dynamic random access memory—DRAM—devices; static random access memory—SRAM—devices, erasable programmable read only memory—EPROM—devices, and electrically erasable programmable read only memory—EEPROM—devices that employ microelectronic circuit elements for each memory bit. These conventional solid state memory devices consume a lot of chip space to store information, thus limiting chip density; and are also relatively slow to program.

Phase change materials useful in PRAM devices include chalcogenide materials such as, germanium-tellurium (Ge—Te) and germanium-antimony-tellurium (Ge—Sb—Te) phase change alloys. The manufacture of PRAM devices include chemical mechanical polishing steps in which chalcogenide phase change materials are selectively removed and the device surface is planarized.

One polishing composition for polishing substrates having a chalcogenide phase change material is disclosed in United States Patent Application Publication No. 20070178700 to Dysard et al. Dysard et al. disclose a chemical mechanical polishing composition for polishing a phase change alloy containing substrate, the composition comprising: (a) a particulate abrasive material in an amount of not more than about 3 percent by weight; (b) at least one chelating agent capable of chelating the phase change alloy, a component thereof, or a substance formed from the phase change alloy material during chemical mechanical polishing; and (c) an aqueous carrier therefor.

There exists a need for chemical mechanical polishing (CMP) compositions capable of selectively removing phase change materials in the manufacture of PRAM devices while providing high removal rates and low dishing.

In one aspect of the present invention, there is provided a method for chemical mechanical polishing of a substrate, comprising: providing a substrate, wherein the substrate comprises a chalcogenide phase change alloy; providing a chemical mechanical polishing composition, wherein the chemical mechanical polishing composition comprises water; 1 to 40 wt % abrasive having an average particle size of ≤50 nm; 0 to 2 wt % quarternary ammonium compound; wherein the chemical mechanical polishing composition is oxidizer free and chelating agent free; wherein the chemical mechanical polishing composition has a pH >6 to 12; providing a chemical mechanical polishing pad; creating dynamic contact at an interface between the chemical mechanical polishing pad and the substrate; and dispensing the chemical mechanical polishing composition onto the chemical mechanical polishing pad at or near the interface between the chemical mechanical polishing pad and the substrate; wherein at least some of the chalcogenide phase change alloy is removed from the substrate.

In another aspect of the present invention, there is provided a method for chemical mechanical polishing of a substrate, comprising: providing a substrate, wherein the substrate comprises a germanium-antimony-tellurium phase change alloy; providing a chemical mechanical polishing composition, wherein the chemical mechanical polishing composition comprises water; 1 to 5 wt % colloidal silica abrasive having an average particle size of 1 to 50 nm; 0.01 to 5 wt % quarternary ammonium compound; wherein the chemical mechanical polishing composition is oxidizer free and chelating agent free; wherein the chemical mechanical polishing composition has a pH 7 to 12; providing a chemical mechanical polishing pad; creating dynamic contact at an interface between the chemical mechanical polishing pad and the substrate; and dispensing the chemical mechanical polishing composition onto the chemical mechanical polishing pad at or near the interface between the chemical mechanical polishing pad and the substrate; wherein at least some of the germanium-antimony-tellurium phase change alloy is removed from the substrate.

DETAILED DESCRIPTION

The chemical mechanical polishing method of the present invention is useful for polishing a substrate containing a chalcogenide phase change alloy. The chemical mechanical polishing compositions used in the method of the present invention provide high chalcogenide phase change alloy removal rates with favorable selectivity over additional materials on the substrate.

Substrates suitable for use in the method of the present invention for chemical mechanical polishing comprise a chalcogenide phase change alloy. Preferably, the chalcogenide phase change alloy is selected from a germanium-tellurium phase change alloy and a germanium-antimony-tellurium phase change alloy. Most preferably, the chalcogenide phase change alloy is a germanium-antimony-tellurium phase change alloy.

Substrates suitable for use in the method of the present invention for chemical mechanical polishing optionally further comprise an additional material selected from phosphor silicate glass (PSG), boro-phosphor silicate glass (BPSG), undoped silicate glass (USG), spin-on-glass (SOG), tetra-ethyl orthosilicate (TEOS), plasma-enhanced TEOS (PE-TEOS), flowable oxide (FOx), high-density plasma chemical vapor deposition (HDP-CVD) oxide, and silicon nitride (e.g., $Si_3N_4$). Preferably, the substrate further comprises an additional material selected from $Si_3N_4$ and TEOS.

Abrasives suitable for use with the present invention include, for example, inorganic oxides, inorganic hydroxides, inorganic hydroxide oxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), titanium oxide ($TiO_2$) or combinations comprising at least one of the foregoing oxides. Modified forms of these inorganic oxides, such as, organic polymer-coated inorganic oxide particles and inorganic coated particles can also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Preferably, the abrasive is a colloidal silica abrasive. Colloidal silica abrasive suitable for use in the present method for chemical mechanical polishing contain at least one of fumed silica, precipitated silica and agglomerated silica.

In some embodiments of the present invention, the abrasive is a colloidal silica having an average particle size of ≤50 nm. In some aspects of these embodiments, the colloidal silica has an average particle size of 1 to 50 nm. In some aspects of these embodiments, the colloidal silica has an average particle size of 1 to 40 nm. In some aspects of these embodiments, the colloidal silica has an average particle size of 1 to 30 nm. In some aspects of these embodiments, the colloidal silica has an average particle size of 1 to 25 nm.

In some embodiments of the present invention, the chemical mechanical polishing composition used contains ≥12 to 40 wt % abrasive, wherein the abrasive is a colloidal silica having an average particle size of ≤50 nm. In some aspects of these embodiments, the colloidal silica has an average particle size of 1 to 50 nm. In some aspects of these embodiments, the colloidal silica has an average particle size of 1 to 40 nm. In some aspects of these embodiments, the colloidal silica has an average particle size of 1 to 30 nm. In some aspects of these embodiments, the colloidal silica has an average particle size of 1 to 25 nm.

In some embodiments of the present invention, the chemical mechanical polishing composition used contains ≥15 to 35 wt % abrasive, wherein the abrasive is a colloidal silica having an average particle size of ≤50 nm. In some aspects of these embodiments, the colloidal silica has an average particle size of 1 to 50 nm. In some aspects of these embodiments, the colloidal silica has an average particle size of 1 to 40 nm. In some aspects of these embodiments, the colloidal silica has an average particle size of 1 to 30 nm. In some aspects of these embodiments, the colloidal silica has an average particle size of 1 to 25 nm.

In some embodiments of the present invention, the chemical mechanical polishing composition used contains 20 to 30 wt % abrasive, wherein the abrasive is a colloidal silica having an average particle size of ≤50 nm. In some aspects of these embodiments, the colloidal silica has an average particle size of 1 to 50 nm. In some aspects of these embodiments, the colloidal silica has an average particle size of 1 to 40 nm. In some aspects of these embodiments, the colloidal silica has an average particle size of 1 to 30 nm. In some aspects of these embodiments, the colloidal silica has an average particle size of 1 to 25 nm.

Preferably, the chemical mechanical polishing composition used in the chemical mechanical polishing method of the present invention further comprises 0.01 to 5 wt %; more preferably 0.1 to 3 wt %; still more preferably 0.5 to 2 wt % of a quarternary ammonium compound. Quarternary ammonium compounds suitable for use in the chemical mechanical polishing composition include tetramethyl ammonium hydroxide, tetraethyl ammonium hydroxide, tetrapropyl ammonium hydroxide, tetraisopropyl ammonium hydroxide, tetracyclopropyl ammonium hydroxide, tetrabutyl ammonium hydroxide, tetraisobutyl ammonium hydroxide, tetratertbutyl ammonium hydroxide, tetrasecbutyl ammonium hydroxide, tetracyclobutyl ammonium hydroxide, tetrapentyl ammonium hydroxide, tetracyclopentyl ammonium hydroxide, tetrahexyl ammonium hydroxide, tetracyclohexyl ammonium hydroxide, and mixtures thereof. Preferred quarternary ammonium compounds include tetramethyl ammonium hydroxide (TMAH) and tetrabutylammonium hydroxide (TBAH).

In some embodiments of the present invention, the chemical mechanical polishing composition further comprises 0.01 to 5 wt % tetramethyl ammonium hydroxide (TMAH). In some aspects of these embodiments, the chemical mechanical polishing composition further comprises 0.1 to 3 wt % tetramethyl ammonium hydroxide (TMAH). In some aspects of these embodiments, the chemical mechanical polishing composition further comprises 0.5 to 2 wt % tetramethyl ammonium hydroxide (TMAH).

In some embodiments of the present invention, the chemical mechanical polishing composition further comprises 0.01 to 5 wt % tetrabutyl ammonium hydroxide (TBAH). In some aspects of these embodiments, the chemical mechanical polishing composition further comprises 0.1 to 3 wt % tetrabutyl ammonium hydroxide (TBAH). In some aspects of these embodiments, the chemical mechanical polishing composition further comprises 0.5 to 2 wt % tetrabutyl ammonium hydroxide (TBAH).

The water contained in the chemical mechanical polishing composition used in the chemical mechanical polishing method of the present invention is preferably at least one of deionized and distilled to limit incidental impurities.

The chemical mechanical polishing composition used in the chemical mechanical polishing method of the present invention optionally further comprises additional additives selected from dispersants, surfactants, buffers and biocides.

The chemical mechanical polishing composition used in the chemical mechanical polishing method of the present invention is oxidizer free. The term "oxidizer free" as used herein and in the appended claims means that the chemical mechanical polishing composition does not contain oxidizers such as hydrogen peroxide, persulfate salts (e.g., ammonium monopersulfate, and potassium dipersulfate) and periodate salts (e.g., potassium periodate).

The chemical mechanical polishing composition used in the chemical mechanical polishing method of the present invention is chelating agent free. The term "chelating agent free" as used herein and in the appended claims means that the chemical mechanical polishing composition does not contain chelating agents capable of chelating a component of the chalcogenide phase change alloy (i.e., germanium, antimony or tellurium) such as dicarboxylic acids (e.g., oxalic acid, malonic acid, succinic acid, maleic acid, phthalic acid, tartaric acid, aspartic acid, glutamic acid), polycarboxylic acids (e.g., citric acid; 1,2,3,4-butane tetracarboxylic acid; polyacrylic acid; polymaleic acid), aminocarboxylic acids (e.g., alpha-amino acids, beta amino acids, omega-amino acids), phosphates, polyphosphates, amino phosphonates, phosphonocarboxylic acids, and polymeric chelating agents.

The chemical mechanical polishing composition used in the chemical mechanical polishing method of the present invention provides efficacy over a pH of >6 to 12. Preferably, the chemical mechanical polishing composition used provides efficacy over a pH of 7 to 12. Acids suitable for use adjusting the pH of the chemical mechanical polishing composition include, for example, nitric acid, sulfuric acid and hydrochloric acid. Bases suitable for use adjusting the pH of the chemical mechanical polishing composition include, for example, ammonium hydroxide and potassium hydroxide.

In some embodiments of the present invention, the chalcogenide phase change alloy is a germanium-antimony-tellurium phase change alloy, the abrasive is a colloidal silica and the substrate further comprises $Si_3N_4$. In some aspects of these embodiments, the chemical mechanical polishing composition exhibits a germanium-antimony-tellurium phase change alloy removal rate that exceeds its $Si_3N_4$ removal rate. In some aspects of these embodiments, the chemical mechanical polishing composition exhibits a germanium-antimony-tellurium phase change alloy to $Si_3N_4$ removal rate selectivity of ≥40:1. In some aspects of these embodiments, the chemical mechanical polishing composition exhibits a germanium-antimony-tellurium phase change alloy to $Si_3N_4$ removal rate selectivity of ≥60:1. In some aspects of these embodiments, the chemical mechanical polishing composition exhibits a germanium-antimony-tellurium phase change alloy to $Si_3N_4$ removal rate selectivity of ≥100:1.

In some embodiments of the present invention, the chalcogenide phase change alloy is a germanium-antimony-tellurium phase change alloy, the abrasive is a colloidal silica and the substrate further comprises tetraethyl orthosilicate (TEOS). In some aspects of these embodiments, the chemical mechanical polishing composition exhibits a germanium-antimony-tellurium phase change alloy removal rate that exceeds its TEOS removal rate. In some aspects of these embodiments, the chemical mechanical polishing composition exhibits a germanium-antimony-tellurium phase change alloy to TEOS removal rate selectivity of ≥40:1. In some aspects of these embodiments, the chemical mechanical polishing composition exhibits a germanium-antimony-tellurium phase change alloy to TEOS removal rate selectivity of ≥60:1. In some aspects of these embodiments, the chemical mechanical polishing composition exhibits a germanium-antimony-tellurium phase change alloy to TEOS removal rate selectivity of ≥100:1. In some aspects of these embodiments, the chemical mechanical polishing composition exhibits a germanium-antimony-tellurium phase change alloy to TEOS removal rate selectivity of ≥200:1.

In some embodiments of the present invention, the chalgogenide phase change alloy is a germanium-antimony-tellurium phase change alloy, the abrasive is a colloidal silica and the chemical mechanical polishing composition exhibits a germanium-antimony-tellurium phase change alloy removal rate of ≥200 Å/min, preferably ≥400 Å/min; more preferably ≥800 Å/min; most preferably ≥1,000 Å/min with a platen speed of 60 revolutions per minute, a carrier speed of 56 revolutions per minute, a chemical mechanical polishing composition flow rate of 200 ml/min, and a nominal down force of 1.0 psi on a 200 mm polishing machine (e.g., an Applied Materials Mirra 200 mm polishing machine) where the chemical mechanical polishing pad comprises a polyurethane polishing layer containing polymeric hollow core microparticles and a polyurethane impregnated non-woven subpad.

In some embodiments of the present invention, the method for chemical mechanical polishing of a substrate, comprises: providing a substrate, wherein the substrate comprises a germanium-antimony-tellurium phase change alloy; providing a chemical mechanical polishing composition, wherein the chemical mechanical polishing composition comprises water; 1 to 5 wt % colloidal silica abrasive having an average particle size of 1 to 50 nm; 0.01 to 5 wt %, preferably 0.1 to 3 wt %, still more preferably 0.5 to 2 wt % quarternary ammonium compound; wherein the chemical mechanical polishing composition is oxidizer free and chelating agent free; wherein the chemical mechanical polishing composition has a pH 7 to 12; providing a chemical mechanical polishing pad; creating dynamic contact at an interface between the chemical mechanical polishing pad and the substrate; and dispensing the chemical mechanical polishing composition onto the chemical mechanical polishing pad at or near the interface between the chemical mechanical polishing pad and the substrate; wherein at least some of the germanium-antimony-tellurium phase change alloy is removed from the substrate. In some aspects of these embodiments, the chemical mechanical polishing composition further exhibits a germanium-antimony-tellurium chalcogenide phase change alloy removal rate of ≥200 Å/min; preferably ≥400 Å/min; more preferably ≥800 Å/min; most preferably 1,000 Å/min with a platen speed of 60 revolutions per minute, a carrier speed of 56 revolutions per minute, a chemical mechanical polishing composition flow rate of 200 ml/min, and a nominal down force of 1.0 psi on a 200 mm polishing machine (e.g., an Applied Materials Mirra 200 mm polishing machine) where the chemical mechanical polishing pad comprises a polyurethane polishing layer containing polymeric hollow core microparticles and a polyurethane impregnated non-woven subpad. In some aspects of these embodiments, the substrate further comprises $Si_3N_4$ and the chemical mechanical polishing composition exhibits a germanium-antimony-tellurium phase change alloy to $Si_3N_4$ removal rate selectivity of ≥40:1; preferably ≥50:1; more preferably 100:1 and a germanium-antimony-tellurium removal rate of ≥200 Å/min; preferably ≥400 Å/min; more preferably ≥800 Å/min; most preferably ≥1,000 Å/min with a platen speed of 60 revolutions per minute, a carrier speed of 56 revolutions per minute, a chemical mechanical polishing composition flow rate of 200 ml/min, and a nominal down force of 1.0 psi on a 200 mm polishing machine (e.g., an Applied Materials Mirra 200 mm polishing machine) where the chemical mechanical polishing pad comprises a polyurethane polishing layer containing polymeric hollow core microparticles and a polyurethane impregnated non-woven subpad. In some aspects of these embodiments, the substrate further comprises tetraethyl orthosilicate (TEOS) and the chemical mechanical polishing composition exhibits a germanium-antimony-tellurium chalcogenide phase change alloy to TEOS removal rate selectivity of ≥40:1; preferably ≥60:1; more preferably ≥100:1; most preferably ≥200:1 and a germanium-antimony-tellurium removal rate of ≥200 Å/min; preferably ≥400 Å/min; more preferably ≥800 Å/min; most preferably ≥1,000 Å/min with a platen speed of 60 revolutions per minute, a carrier speed of 56 revolutions per minute, a chemical mechanical polishing composition flow rate of 200 ml/min, and a nominal down force of 1.0 psi on a 200 mm polishing machine (e.g., an Applied Materials Mirra 200 mm polishing machine) where the chemical mechanical polishing pad comprises a polyurethane polishing layer containing polymeric hollow core microparticles and a polyurethane impregnated non-woven subpad.

Some embodiments of the present invention will now be described in detail in the following Examples.

EXAMPLES

Chemical Mechanical Polishing Compositions

The chemical mechanical polishing compositions (CMPC's) tested are described in Table 1. The chemical mechanical polishing composition A is a comparative formulation, which is not within the scope of the claimed invention.

TABLE 1

| CMPC | quarternary ammonium compound (wt %)* | colloidal silica abrasive (wt %)[a] | $H_2O_2$ (wt %) | pH |
|---|---|---|---|---|
| A | 0.05 | 4 | 1 | 10 |
| 1 | 0.05 | 4 | 0 | 10 |
| 2 | 0.05 | 4 | 0 | 7 |

*the quarternary ammonium compound used was tetrabutylammonium hydroxide (TBAH)
[a] Klebosol ® PL1598B25 colloidal silica manufactured by AZ Electronic Materials

Polishing Tests

The chemical mechanical polishing compositions described in Table 1 were tested using an Applied Materials, Inc. Mirra 200 mm polishing machine equipped with an ISRM detector system using an IC1010™ polyurethane polishing pad (commercially available from Rohm and Haas Electronic Materials CMP Inc.) under a 1 psi down force, a chemical mechanical polishing composition flow rate of 200 ml/min, a platen speed of 60 rpm and a carrier speed of 56 rpm. Gallium-antimony-tellurium (GST) blanket wafers from SKW Associates Inc. were polished under the noted conditions. The GST removal rate data reported in Table 2 was determined by cross sectional transmission electron microscope (TEM) observation. $Si_3N_4$ and TEOS blanket wafers from ATDF were polished under the noted conditions. The $Si_3N_4$ and TEOS removal rates reported in Table 2 were measured using a ThermWave Optiprobe® 2600 film thickness measurement system.

The results of the polishing tests are presented in Table 2.

TABLE 2

| CMPC | Ge—Sb—Te chalcogenide phase change alloy removal rate (Å/min) | $Si_3N_4$ removal rate (Å/min) | TEOS removal rate (Å/min) |
| --- | --- | --- | --- |
| A | dissolved in CMPC before polishing | — | — |
| 1 | 1716 | 14 | 1 |
| 2 | 844 | 31 | 3 |

I claim:

1. A method for chemical mechanical polishing of a substrate, comprising:
   providing a substrate, wherein the substrate comprises a germanium-antimony-tellurium phase change alloy;
   providing a chemical mechanical polishing composition, wherein the chemical mechanical polishing composition consists essentially of water; 1 to 5 wt % colloidal silica abrasive particles having an average particle size of 1 to 50 nm; 0.01 to 5 wt % quaternary ammonium compound; and, optionally, an acid or base for adjusting pH; wherein the quaternary compound is tetrabutyl ammonium hydroxide; wherein the acid is selected from nitric acid, sulfuric acid and hydrochloric acid; wherein the base is selected from ammonium hydroxide and potassium hydroxide; wherein the chemical mechanical polishing composition is oxidizer free and chelating agent free; wherein the chemical mechanical polishing composition has a pH 7 to 12;
   providing a chemical mechanical polishing pad;
   creating dynamic contact at an interface between the chemical mechanical polishing pad and the substrate; and
   dispensing the chemical mechanical polishing composition onto the chemical mechanical polishing pad at or near the interface between the chemical mechanical polishing pad and the substrate;
   wherein at least some of the germanium-antimony-tellurium phase change alloy is removed from the substrate; wherein the substrate further comprises tetraethyl orthosilicate (TEOS); and, wherein the chemical mechanical polishing composition exhibits a germanium-antimony-tellurium phase change alloy to TEOS removal rate selectivity of >60:1.

2. The method of claim 1, wherein the chemical mechanical polishing composition exhibits a germanium-antimony-tellurium phase change alloy removal rate of >200 Å/min with a platen speed of 60 revolutions per minute, a carrier speed of 56 revolutions per minute, a chemical mechanical polishing composition flow rate of 200 ml/min, and a nominal down force of 1.0 psi on a 200 mm polishing machine where the chemical mechanical polishing pad comprises a polyurethane polishing layer containing polymeric hollow core microparticles and a polyurethane impregnated non-woven subpad.

* * * * *